United States Patent [19]
Sato et al.

[11] Patent Number: 6,056,384
[45] Date of Patent: May 2, 2000

[54] FAILURE DIAGNOSING CIRCUIT AND METHOD

[75] Inventors: Morio Sato; Takehiko Nanri, both of Wako, Japan

[73] Assignee: Honda Giken Kogyo Kabushiki Kaisha, Tokyo, Japan

[21] Appl. No.: 09/168,176

[22] Filed: Oct. 8, 1998

[30] Foreign Application Priority Data

Aug. 10, 1997 [JP] Japan ..................................... 9-275557
Oct. 8, 1997 [JP] Japan ..................................... 9-275557

[51] Int. Cl.$^7$ ....................................................... H02P 7/00
[52] U.S. Cl. .............................................. 312/439; 361/23
[58] Field of Search ..................................... 318/439, 254, 318/434; 361/23, 31; 363/40, 41, 50, 55; 324/651, 98, 144

[56] References Cited

U.S. PATENT DOCUMENTS

| | | | |
|---|---|---|---|
| 4,978,898 | 12/1990 | Tsukahara et al. ....................... | 318/280 |
| 5,111,123 | 5/1992 | Hach et al. ............................... | 318/434 |
| 5,153,487 | 10/1992 | Hennig ..................................... | 318/293 |
| 5,510,725 | 4/1996 | Schantz, Jr. et al. .................... | 324/768 |
| 5,703,490 | 12/1997 | Kennedy .................................. | 324/650 |
| 5,726,541 | 3/1998 | Glenn et al. ............................. | 318/479 |
| 5,825,597 | 10/1998 | Young ....................................... | 361/31 |

FOREIGN PATENT DOCUMENTS 62-198897  12/1987  Japan .

*Primary Examiner*—Jonathan Salata

[57] ABSTRACT

To provide a failure diagnosing circuit capable of carrying out failure diagnosis of respective switching elements of a bridge circuit without rotating a motor. Pull up/down terminals and as well as monitor terminals are respectively connected to both input terminals of a motor. The pull up/down terminals selectively provide two states: a pull up state providing voltage 5 V for failure diagnosis to the motor input terminals via resistors and a pull down state providing ground potential to the motor input terminals via the resistors. A failure diagnosing circuit switches the two states of the pull up/down terminals, opens and closes any one element of switching elements and monitors a change in the potential of the monitor terminal corresponding to each of the combinations of switching the states and opening and closing of the switching elements by which failure diagnosis of the opened and closed switching element is carried out.

19 Claims, 7 Drawing Sheets

FIG. 2

| EIGHT WAYS OF INPUT CONDITIONS | MS1 | MS2 | PWM | SQ1 | SQ2 | SQ3 | SQ4 | USE |
|---|---|---|---|---|---|---|---|---|
| FIRST INPUT CONDITION | L | L | L | L | L | L | L | FOR DIAGNOSING SHORT CIRCUIT FAILURE OF Q1-Q4 |
| SECOND INPUT CONDITION | L | L | H | L | L | L | L | |
| THIRD INPUT CONDITION | H | L | L | H | L | L | L | FOR DIAGNOSING OPEN FAILURE OF Q1 REGULAR ROTATION |
| FOURTH INPUT CONDITION | H | L | H | H | L | L | H | |
| FIFTH INPUT CONDITION | L | H | L | L | L | H | L | FOR DIAGNOSING OPEN FAILURE OF Q3 REVERSE ROTATION |
| SIXTH INPUT CONDITION | L | H | H | L | H | H | L | |
| SEVENTH INPUT CONDITION | H | H | L | L | H | L | H | BRAKING |
| EIGHTH INPUT CONDITION | H | H | H | L | (H) | L | H | FOR DIAGNOSING OPEN FAILURE OF Q4 |
|  |  |  |  |  |  | L | (L) | FOR DIAGNOSING OPEN FAILURE OF Q2 |

FIG. 3

| OBJECT | DIAGNOSING METHOD (01-04 ALL OFF) | DETERMINATION OF SHORTCIRCUIT FAILURE |
|---|---|---|
| Q1 | PULL DOWN TERMINAL M+ VIA RESISTOR R+ | T+ IS 0V → NORMAL<br>T+ IS 12V → FAILURE |
| Q2 | PULL UP TERMINAL M+ VIA RESISTOR R+ | T+ IS 5V → NORMAL<br>T+ IS 0V → FAILURE |
| Q3 | PULL DOWN TERMINAL M- VIA RESISTOR R- | T- IS 0V → NORMAL<br>T- IS 12V → FAILURE |
| Q4 | PULL UP TERMINAL M- VIA RESISTOR R- | T- IS 5V → NORMAL<br>T- IS 0V → FAILURE |

FIG. 4

| FIRST AND SECOND INPUT CONDITION | | | OUTPUT | | | | | | | | OBJECT OF DIAGNOSING SHORT CIRCUIT FAILURE |
|---|---|---|---|---|---|---|---|---|---|---|---|
| MS1 | MS2 | PWM | SD+ | SU+ | SD- | SU- | SQ1 | SQ2 | SQ3 | SQ4 | |
| L | L | L | H | L | L | L | L | L | L | L | Q1 |
| L | L | H→L | L | H | L | L | L | L | L | L | Q2 |
| L | L | H→L | L | H | L | L | L | L | L | L | |
| L | L | H→L | L | L | H | L | L | L | L | L | Q3 |
| L | L | H→L | L | L | H | L | L | L | L | L | |
| L | L | H→L | L | L | L | H | L | L | L | L | Q4 |
| L | L | H→L | L | L | L | H | L | L | L | L | |
| L | L | H→L | H | L | L | L | L | L | L | L | Q1 |
| L | L | H→L | H | L | L | L | L | L | L | L | |

FIG. 5

| OBJECT | DIAGNOSING METHOD (ONLY OBJECT ELEMENT IS PULLED DOWN) | DETERMINATION OF OPEN FAILURE | |
|---|---|---|---|
| Q1 | PULL DOWN TERMINAL M+ VIA RESISTOR R+ | T+ IS 12V → NORMAL | T+ IS 0V → FAILURE |
| Q2 | PULL UP TERMINAL M+ VIA RESISTOR R+ | T+ IS 0V → NORMAL | T+ IS 5V → FAILURE |
| Q3 | PULL DOWN TERMINAL M- VIA RESISTOR R- | T- IS 12V → NORMAL | T- IS 0V → FAILURE |
| Q4 | PULL UP TERMINAL M- VIA RESISTOR R- | T- IS 0V → NORMAL | T- IS 5V → FAILURE |

FAILURE DIAGNOSING CIRCUIT AND METHOD

BACKGROUND OF THE INVENTION

1. Field of the Invention

The present invention relates to a failure diagnosing circuit and method capable of carrying out failure diagnosis of switching elements constituting a bridge circuit that drives a motor.

2. Description of Related Art

A check circuit for testing a bridge circuit connected to a direct current power source via resistors is described in Japanese Unexamined Utility Model Publication No. Sho 62-198897.

This check circuit is provided with a circuit in which switches are connected in series with the direct current power source and high impedance elements are connected in parallel with the switches. A voltage drop between the high impedance elements is detected when the switches are opened.

This conventional check circuit has several disadvantages. According to this check circuit, each of the switching elements constituting the bridge circuit cannot be individually subjected to failure diagnosis. Further, open failure and a shortcircuit failure of each of the switching elements cannot be detected.

SUMMARY AND OBJECTS OF THE INVENTION

An object of the present invention is to overcome the disadvantages of the conventional check circuit.

Another object of the present invention is provide for individual testing and diagnosis of each switching element in a bridge circuit that drives a motor.

Another object of the invention is test for open and short-circuit type failures. Yet another object of the invention is to individually diagnose each switching element in a bridge circuit for open and short-circuit type failures.

To achieve these objects, the present invention utilizes a failure diagnosing circuit for carrying out failure diagnosis of switching elements constituting a bridge circuit that drives a motor.

The bridge circuit that is the object of diagnosis and testing is formed by connecting a first and a second switching element in series and connecting a third and fourth switching element in series, connecting one motor input terminal between the first and the second switching elements and connecting a second motor input terminal between the third and the fourth switching elements.

The failure diagnosis circuit includes pull up/down terminals and monitor terminals that are respectively connected to the both input terminals of the motor. The pull up/down terminals selectively provide two states including a pull up state for providing voltage for failure diagnosis to the motor input terminals via resistors and a pull down state for providing ground potential to the motor input terminals via the resistors.

The failure diagnosing circuit switches the two states of the pull up/down terminals and opens and closes any one element of the switching elements and monitors a change in potential of the monitor terminal in correspondence with each combination of switching the states and opening and closing of the switching elements thereby carrying out the failure diagnosis of the opened and the closed switching elements.

Thereby, diagnosis of open failure and shortcircuit failure of each of the switching elements can be carried out. Further, in this case, it is not necessary to feed electricity to the motor.

The objects of the present are further achieved with a method for conducting failure diagnosis of the bridge circuit including a step of carrying out failure diagnosis operation for switching the two states of the pull up/down terminals of the both input terminals of the motor with all of the switching elements in an opened state; followed by a step of carrying out failure diagnosis operation by switching the two states of the pull up/down terminals of the both input terminals of the motor and bringing any one of the switching elements into a closed state.

First, diagnosis of shortcircuit failure is carried out and later, diagnosis of open failure is carried out by which unnecessary conduction of electricity to the motor can be prevented during the diagnostic procedure.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF EXPLANATION OF THE DRAWINGS

The present invention will become more fully understood from the detailed description given hereinbelow and the accompanying drawings which are given by way of illustration only, and thus are not limitative of the present invention, and wherein:

FIG. 2 illustrates an example of classifying 8 ways of input conditions formed by three of input terminals;

FIG. 3 is an explanatory diagram for explaining a method of diagnosing short-circuit failure of switching elements;

FIG. 4 is an explanatory diagram for explaining input and output of a control circuit in diagnosing short-circuit failure;

FIG. 5 is an explanatory diagram for explaining a method of diagnosing open failure of the switching elements;

DETAILED DESCRIPTION OF THE PREFERRED EMBODIMENTS

An explanation will be given of embodiments of the present invention in reference to the drawings as follows.

Figure 1:
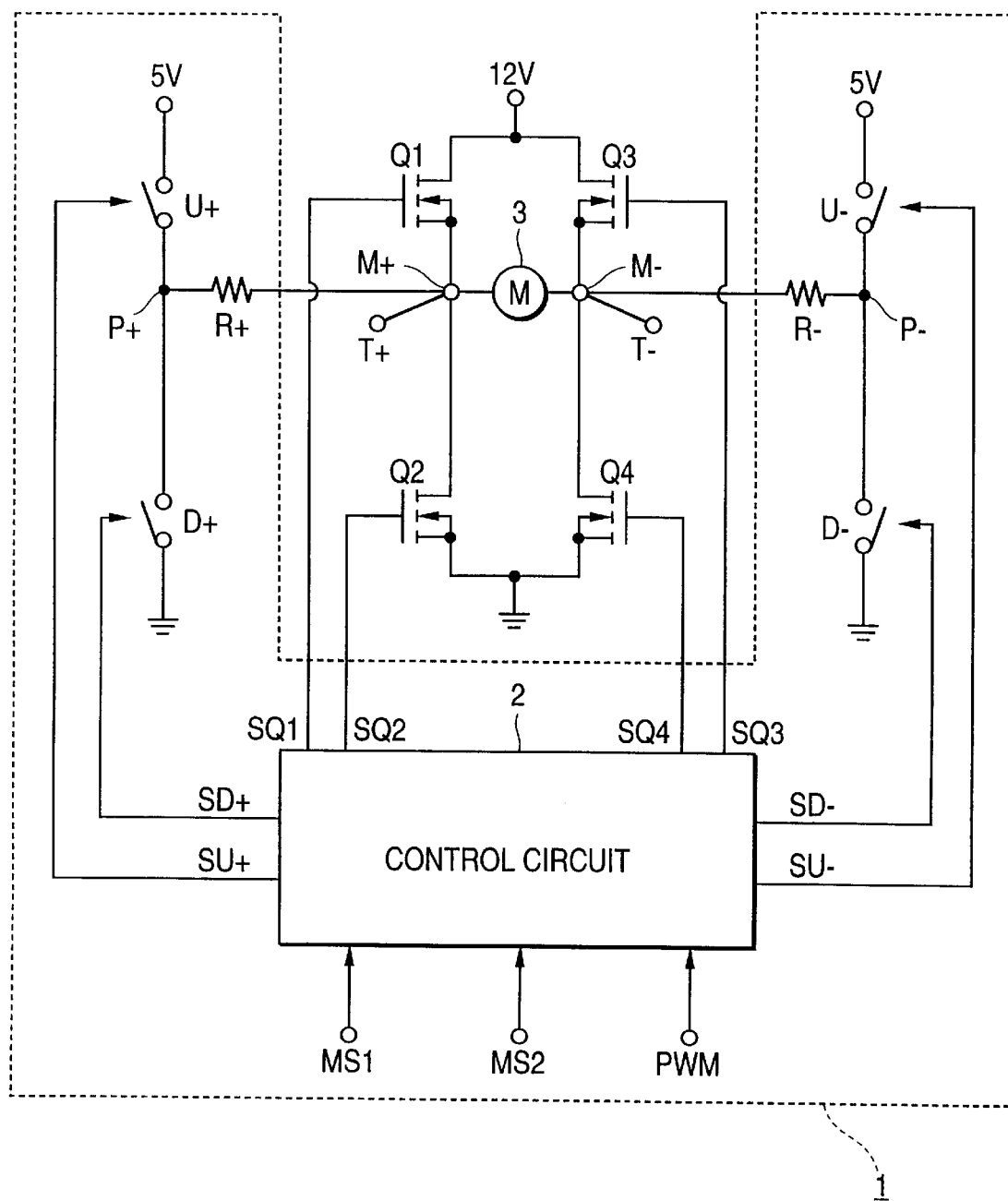
FIG. 1 is a simplified circuit diagram of a failure diagnosing circuit according to the present invention.

FIG. 1 is a simplified circuit diagram of a failure diagnosing circuit 1 according to the present invention.

A bridge circuit is constituted by first through fourth switching elements Q1 through Q4. Each of the switching elements Q1–Q4 is preferably constructed with a field effect transistor (FET).

The first and the second switching elements Q1 and Q2 are connected in series and the third and the fourth switching elements Q3 and Q4 are connected in series.

One motor input terminal M+ is connected between the switching elements Q1 and Q2 and the other motor input terminals M− is connected between the switching elements Q3 and Q4.

A monitor terminal T+ is connected to the one motor input terminal M+. Another monitor terminal T− is connected to the other motor input terminal M−.

The failure diagnosing circuit 1 is further provided with a control circuit 2.

Further, the failure diagnosing circuit 1 is provided with resistors R+ and R−, a switch U+ for pulling up the one motor input terminal M+ via the resistor R+, a switch D+ for pulling down the one motor input terminal M+ via the resistor R+, a switch U− for pulling up the other motor input terminal M− via the resistor R− and a switch D− for pulling down the other motor input terminal M− via the resistor R−. Each of the switches may be constructed with, for example, a relay.

One terminal of the resistor R+ is connected to the motor input terminal M+ and the other terminal of the resistor R+ is connected to a pull up/down terminal P+.

One terminal of the resistor R− is connected to the motor input terminal M− and the other terminal of the resistor R− is connected to a pull up/down terminal P−.

A voltage (potential) for failure diagnosis for pulling up is preferably 5 V and a power source voltage for the bridge circuit (power source voltage) is preferably 12 V. The pull up voltage at a lower potential than the power source voltage. The bridge circuit may constitute a bridge circuit that drives a motor mounted, for example on an automobile and 12 V may be formed by a vehicle-mounted battery.

A controller unit for controlling a vehicle (not illustrated) which may be constructed with a microcomputer or the like, supplies respective control output signals to input terminals MS1, MS2 and PWM of the control circuit 2.

Input terminals of the control circuit 2 include three input terminals MS1, MS2 and PWM with potential at H level or L level as an input thereto.

The control circuit 2 outputs control signals based on input conditions determined by the voltages applied to input terminals MS1, MS2 and PWM. The control signals comprise signals SD+, SU+, SD− and SU− as well as signals SQ1 through SQ4 at H level or L level.

The control signals and their effects on the failure diagnosing circuit 1 are as follows:

When the signal SD+ is at H level, the switch D+ is turned ON and the motor input terminal M+ is pulled down via the resistor R+;

When the signal SD− is at H level, the switch D− is turned ON and the motor input terminal M− is pulled down via the resistor R−;

When the signal SU+ is at H level, the switch U+ is turned ON and the motor input terminal M+ is pulled up via the resistor R+;

When the signal SU− is at H level, the switch U− is turned ON and the motor input terminal M− is pulled up via the resistor R−;

When the signal SD+ is at L level, the switch D+ is turned OFF;

When the signal SD− is at L level, the switch D− is turned OFF;

When the signal SU+ is at L level, the switch U+ is turned OFF;

When the signal SU− is at L level, the switch U− is turned OFF;

When the signal SQ1 is at H level, the switch element Q1 is turned ON;

When the signal SQ2 is at H level, the switch element Q3 is turned ON;

When the signal SQ3 is at H level, the switch element Q4 is turned ON;

When the signal SQ4 is at H level, the switch element Q4 is turned ON;

When the signal SQ1 is at L level, the switch element Q1 is turned OFF;

When the signal SQ2 is at L level, the switch element Q2 is turned OFF;

When the signal SQ3 is at L level, the switch element Q3 is turned OFF; and

When the signal SQ4 is at L level, the switch element Q4 is turned OFF.

FIG. 2 shows an example of 8 input conditions formed by different signal state combinations of the three input terminals MS1, MS2 and PWM.

Under a first input condition, the three input terminals MS1, MS2 and PWM are respectively at L, L and L level. All of the signals SQ1 through SQ4 are at L level and all of the switching elements Q1 through Q4 are turned OFF.

Under a second input condition, the three input terminals MS1, MS2 and PWM are respectively at L, L and H levels. All of the signals SQ1 through SQ4 are at L level and all of the switching elements Q1 through Q4 are turned OFF.

The first and the second input conditions are used for diagnosing shortcircuit failure of the switching elements Q1 through Q4.

Under a third input condition, the three input terminals MS1, MS2 and PWM are respectively at H, L and L level. Only the signal SQ1 is at H level among the signals SQ1 through SQ4 and only the switching element Q1 is turned ON.

The third input condition is used for diagnosing open failure of the switching element Q1.

Under a fourth input condition, the three input terminals MS1, MS2 and PWM are respectively at H, L and H level. Only the signals SQ1 and SQ4 are at H level among the signals SQ1 through SQ4 and only the switching elements Q1 and Q4 are turned ON.

The fourth input condition is used when a motor 3 is rotated in right (or left) direction.

Under a fifth input condition, the three input terminals MS1, MS2 and PWM are respectively at L, H and L level. Only the signal SQ3 is at H level among the signals SQ1 through SQ4L and only the switching element Q3 is turned ON.

The fifth input condition is used for diagnosing an open failure of the switching element Q3.

Under a sixth input condition, the three input terminals MS1, MS2 and PWM are respectively at L, H and H level. Only the signals SQ2 and SQ3 are at H level among the signals SQ1 through SQ4 and only the switching elements Q2 and Q3 are turned ON.

The sixth input condition is used when the motor 3 is rotated in left (or right) direction.

Under a seventh input condition, the three input terminals MS1, MS2 and PWM are respectively at H, H and L level. Only the signals SQ2 and SQ4 are at H level among the signals SQ1 through SQ4 and only the switching elements Q2 and Q4 are turned ON.

The seventh input condition is used when the motor is difficult to rotate due to braking the motor 3.

Under an eighth input condition, the three input terminals MS1, MS2 and PWM are respectively at H, H and H level. Among the signals SQ1 through SQ4, only either of the signals SQ2 and SQ4 is at H level and only either of the switching elements Q2 and Q4 is turned ON.

The eighth input condition is used for diagnosing open failure of the switching element Q2 when only the signal SQ2 is at H level.

The eighth input condition is used for diagnosing open failure of the switching element Q4 when only the signal SQ4 is at H level.

FIG. 3 is an explanatory diagram for explaining a method of diagnosing shortcircuit failure of the switching elements. All of the switching elements Q1 through Q4 are turned OFF.

When shortcircuit failure diagnosis of the switching element Q1 is carried out, the motor input terminal M+ is pulled down via the resistor R+.

Further, in the case where the potential of the monitor terminal T+ is measured, no failure is caused when the potential of the monitor terminal T+ is 0 V, however, shortcircuit failure is caused when it is 12 V.

When shortcircuit failure diagnosis of the switching element Q2 is carried out, the motor input terminal M+ is pulled up via the resistor R+.

Further, in the case where the potential of the monitor terminal T+ is measured, no failure is caused when the potential of the monitor terminal T+ is 5 V, however, shortcircuit failure is caused when it is 0 V.

When shortcircuit failure diagnosis of the switching element Q3 is carried out, the motor input terminal M− is pulled down via the resistor R−.

Further, in the case where the potential of the monitor terminal T− is measured, no failure is caused when the potential of the monitor terminal T− is 0 V, however, shortcircuit failure is caused when it is 12 V.

When shortcircuit failure diagnosis of the switching element Q4 is carried out, the motor input terminal M− is pulled up via the resistor R−.

Further, in the case where the potential of the monitor terminal T− is measured, no failure is caused when the potential of the monitor terminal T− is 5 V, however, shortcircuit failure is caused when it is 0 V.

FIG. 4 is an explanatory diagram for explaining the inputs and outputs of the control circuit 2 when diagnosing shortcircuit failures.

The "first input condition" and the "second input condition" in FIG. 2 are used and all of the signals SQ1 through SQ4 are at L level.

First, when the input terminals MS1, MS2 and PWM are respectively at initial states of L, L, L level, only the signal SD+ is at H level among the signals SD+, SU+, SD− and SU−. Thereby, the motor input terminal M+ is pulled down via the resistor R+ and shortcircuit failure diagnosis of the switching element Q1 can be accomplished.

Next, when the input terminals MS1, MS2 and PWM are respectively shifted to L, L, H level, only the signal SU+ remains at H level among the signals SD+, SU+, SD− and SU−. Thereby, the motor input terminal M+ is pulled up via the resistor R+ and shortcircuit failure diagnosis of the switching element Q2 can be accomplished.

Next, when the input terminals MS1, MS2 and PWM are respectively shifted to L, L, L level, only the signal SU− remains at H level among the signals SD+, SU+, SD− and SU−. At this moment, the motor input terminals M+ is pulled up via the resistor R+ and shortcircuit failure diagnosis of the switching element Q2 can be accomplished.

Next, when the input terminals MS1, MS2 and PWM are respectively shifted to L, L, H level, only the signal SD− is brought to H level among the signals SD+, SU+, SD− and SU−. Thereby, the motor input terminal M− is pulled down via the resistor R− and shortcircuit failure diagnosis of the switching element Q3 can be accomplished.

Next, when the input terminals MS1, MS2 and PWM are respectively shifted to L, L, L level, only the signal SD+ remains at H level among the signals SD+, SU+, SD− and SU−. At this moment, the motor input terminal M− is pulled down via the resistor R− and shortcircuit failure diagnosis of the switching element Q3 can be accomplished.

Next, when the input terminals MS1, MS2 and PWM are respectively shifted to L, L, H level, only the signal SU− is brought into H level among the signals SD+, SU+, SD− and SU−. Thereby, the motor input terminal M− is pulled up via the resistor R− and shortcircuit failure diagnosis of the switching element Q4 can be accomplished.

Next, when the input terminals MS1, MS2 and PWM are respectively shifted to L, L, L level, only the signal SU− remains at H level among the signals SD+, SU+, SD− and SU−. At this moment, the motor input terminal M− is pulled up via the resistor R− and shortcircuit failure diagnosis of the switching element Q4 can be accomplished.

Next, when the input terminals MS1, MS2 and PWM are receptively shifted to L, L, H level, only the signal SD+ is brought into H level among the signals SD+,SU+, SD− and SU−. Thereby, the motor input terminal M+ is pulled down via the resistor R+ and shortcircuit failure diagnosis of the switching element Q1 can be carried out.

Next, when the input terminals MS1, MS2 and PWM are respectively shifted to L, L, L level, only the signal SD− remains at H level among the signals SD+, SU+, SD− and SU− to return to the initial state.

At this moment, the motor input terminal M+ is pulled down via the resistor R+ and shortcircuit failure diagnosis of the switching element Q1 can be carried out.

According to the control circuit 2 executing such an input and output operation, for example, the number of switching operations at the input terminals MS1, MS2 and PWM respectively from L, L, L level to L, L, H level may be counted by a 2 bit counter and output of the signals SD+, SU−, SD− and SU− may be switched based on this counted as follows:

When a counted value counted by the 2 bit counter is 0, only SD+ is brought into H level;

When the counted value counted by the 2 bit counter is 1, only SU+ is brought into H level;

When the counted value counted by the 2 bit counter is 2, only SD− is brought into H level; and When the counted value counted by the 2 bit counter is 3, only SU− is brought into H level.

FIG. 5 is an explanatory diagram for explaining a method of diagnosing an open failure of the switching elements. Only an object of diagnosing open failure among the switching elements Q1 through Q4 is made ON.

When open failure diagnosis of the switching element Q1 is carried out, the motor input terminal M+ is pulled down via the resistor R+.

Further, in the case where the potential of the monitor terminal T+ is measured, no failure is caused when the potential of the monitor terminal T+ is 12 V, however, open failure is caused when it is 0 V.

When open failure diagnosis of the switching element Q2 is carried out, the motor input terminal M+ is pulled up via the resistor R+.

Further, in the case where the potential of the monitor terminal T+ is measured, no failure is caused when the potential of the monitor terminal T+ is 0 V, however, open failure is caused when it is 5 V.

When open failure diagnosis of the switching element Q3 is carried out, the motor input terminal M− is pulled down via the resistor R−.

Further, in the case where the potential of the monitor terminal T− is measured, no failure is caused when the potential of the monitor terminal T− is 12 V, however, open failure is caused when it is 0 V.

When open failure diagnosis of the switching element Q4 is carried out, the motor input terminal M− is pulled up via the resistor R−.

Further, in the case where the potential of the monitor terminal T− is measured, no failure is caused when the potential of the monitor terminal T− is 0 V, however, open failure is caused when it is 5 V.

Figure 6:
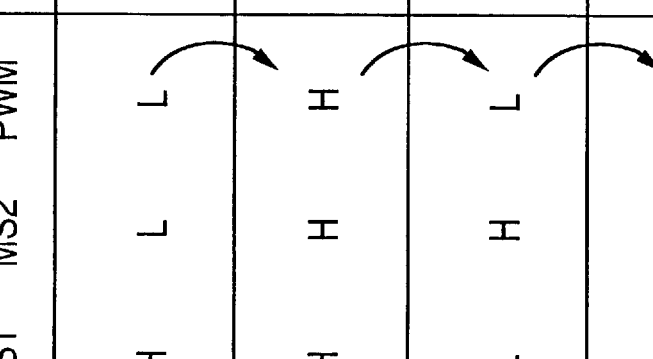
FIG. 6 is an explanatory diagram for explaining input and output of the control circuit in diagnosing open failure.

FIG. 6 is an explanatory diagram for explaining inputs and outputs of the control circuit 2 when diagnosing open failures. During this open failure diagnosis, the "third input condition", the "fifth input condition" and the "eighth input condition" in FIG. 2 are used.

First, in a state where the input terminals MS1, MS2 and PWM are respectively at H, L, L level, only the signal SD+ is at H level among the signals SD+, SU+, SD− and SU−. Further, only the signal SQ1 is at H level among the signals SQ1 through SQ4. Thereby, the motor input terminal M+ is pulled down via the resistor R+ and open failure diagnosis of the switching element Q1 can be accomplished.

Next, when the input terminals MS1, MS2 and PWM are respectively shifted to H, H, H level, only the signal SU− is at H level among the signals SD+, SU+, SD− and SU−. Further, only the signal SQ4 is at H level among the signals SQ1 through SQ4. Thereby, the motor input terminal M− is pulled up via the resistor R− and open failure diagnosis of the switching element Q4 can be accomplished.

Next, when the input terminals MS1, MS2 and PWM are respectively shifted to L, H, L level, only the signal SD− is brought into H level among the signals SD+, SU+, SD− and SU−. Further, only the signal SQ3 is brought into H level among the signals SQ1 through SQ4. Thereby, the motor input terminal M− is pulled down via the resistor R− and open failure diagnosis of the switching element Q3 can be accomplished.

Next, when the input terminals MS1, MS2 and PWM are respectively shifted to H, H, H level, only the signal SU+ is brought into H level among the signals SD+, SU+, SD− and SU−. Further, only the signal SQ2 is brought into H level among the signals SQ1 through SQ4. Thereby, the motor input terminal M+ is pulled up via the resistor R+ and open failure diagnosis of the switching element Q2 can be accomplished.

Figure 7:
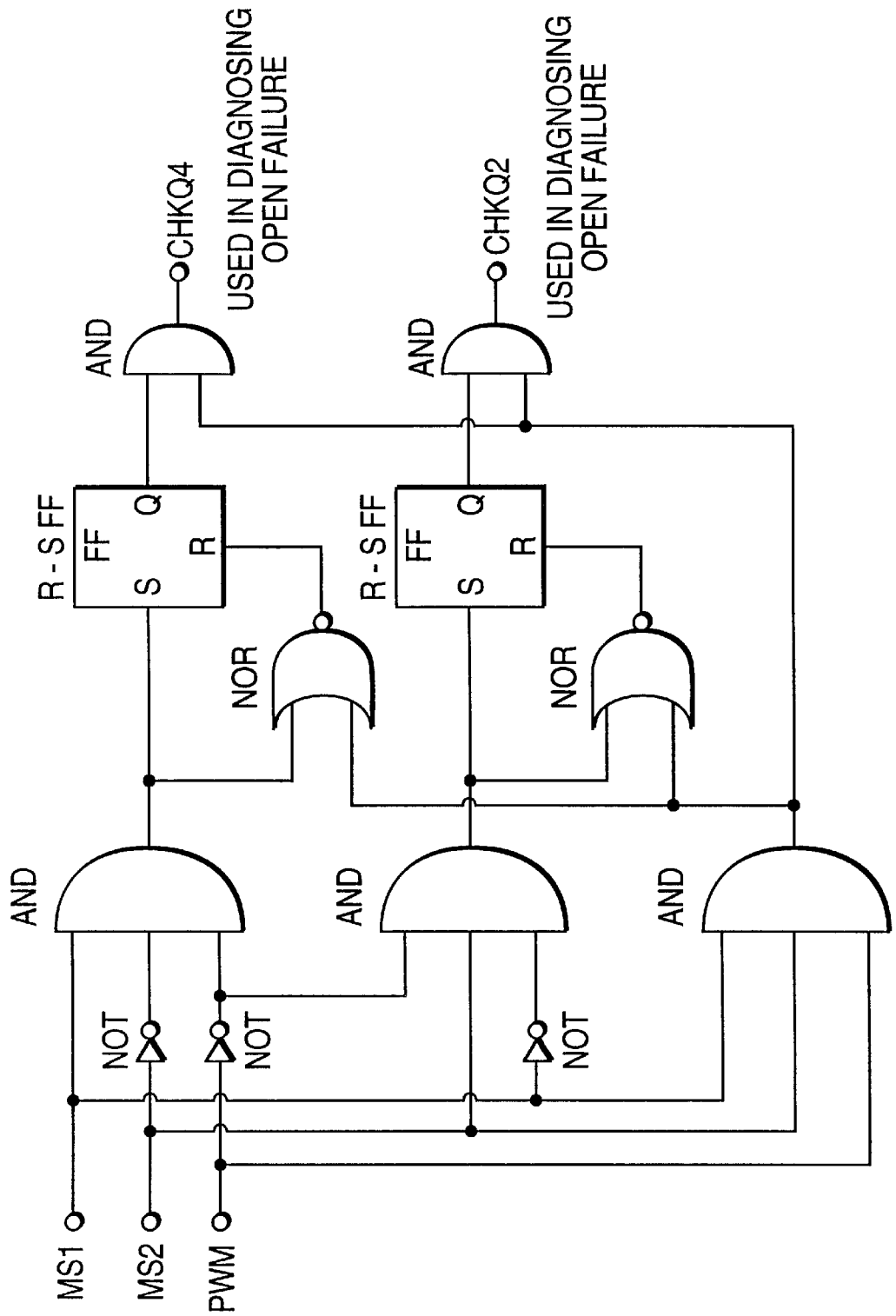
FIG. 7 shows an example of a circuit used in diagnosing open failure among circuits provided to the control circuit.

The control circuit 2 executing such input and output operations is preferably constructed as shown in FIG. 7.

According to the circuit of FIG. 7, when the input terminals MS1, MS2 and PWM are respectively switched from H, L, L level to H, H, H level, a terminal CHKQ4 is brought into H level. When the terminal CHKQ4 is brought into H level, only the signal SU− is brought into H level among the signals SD−, SU+, SD− and SU− and only the signal SQ4 is brought into H level among the signals SQ1 through SQ4.

According to the circuit of FIG. 7, when the input terminals MS1, MS2 and PWM are respectively switched from L, H, L level to H, H, H level, a terminal CHKQ2 is brought into H level. When the terminal CHKQ2 is brought into H level, only the signal SU+ is brought into H level among the signals SD+, SU+, SD− and SU− and only the signal SQ2 is brought into H level among the signals SQ1 through SQ4.

Further, the failure diagnosing circuit 1 may be constituted such that a general monitor terminal TT selectively connected to a motor input terminal is provided and the motor input terminal connected to the switching element may be selected in correspondence with each switching terminal.

For example, the circuit 1 may be provided with a selecting circuit connecting the general monitor terminal TT to the motor input terminal M+ in diagnosing failure of the switching elements Q1 and Q2 and connecting the general monitor terminal TT to the motor input terminal M− in diagnosing failure of the switching elements Q3 and Q4.

By monitoring the potential of the general monitor terminal TT, time and labor for monitoring both of the motor input terminals M+ and M− can be eliminated.

In diagnosing open failure (a failure in which a switch is made OFF although it is to be made ON), no failure is caused when the general monitor terminal TT is at power source potential of 12 V, however, open failure is caused when it is at the ground potential of 0 V in the case of pulling down operation.

In diagnosing open failure (a failure in which a switch is made OFF although it is to be made ON), no failure is caused when the general monitor terminal TT is at ground potential of 0 V, however, open failure is caused when it is at the pull up potential of 5 V in the case of pulling up operation.

In diagnosing shortcircuit failure (a failure in which a switch is made ON although it is to be made OFF), no failure is caused when the general monitor terminal TT is at ground potential of 0 V, however, shortcircuit failure is caused when it is at power source potential of 12 V in the case of pulling down operation.

In diagnosing shortcircuit failure (a failure in which a switch is made ON although it is to be made OFF), no failure is caused when the general monitor terminal TT is at pull up potential of 5 V, however, shortcircuit failure is caused when it is at ground potential of 0 V in the case of pulling up operation.

Furthermore, the resistors R+ and R− may be attached to the bridge circuit only when failure diagnosis is carried out.

The switching means D+, D−, U+ and U− may be attached to the bridge circuit only when failure diagnosis is carried out.

Thereby, a failure diagnosing circuit may be constructed having a small-size and low cost that is highly reliable.

As an alternative, the control circuit 2 may be constructed with a CPU, ROM and RAM and output control signals as a result of calculations performed by the CPU.

Thereby, open/shortcircuit failure diagnosis of switching elements of a bridge circuit can be carried out.

The bridge circuit may be also be constructed such that the switching elements Q1 and Q3 are located at a low potential side, the switching elements Q2 and Q4 are located at a high potential side whereby the pulling down operation is carried out in diagnosing failure of the switching elements on the high potential side and pulling up operation is carried out in diagnosing failure of the switching elements on the low potential side.

In carrying out open failure diagnosis by turning ON switching elements of a bridge circuit, a delay circuit for failure diagnosis delaying switching operation for turning ON the switching elements may be provided in order to prevent totem pole shortcircuit (shortcircuit between power source potential of 12 V and ground potential of 0) caused by a switching element on the high potential side and a switching element on the low potential side.

Similarly, a delay circuit for failure diagnosis delaying switching operation for turning ON switching elements in order to prevent totem pole shortcircuit (shortcircuit between pull up potential of 5 V and ground potential of 0 V) caused by the switching means SD+ and SU+ or the switching means SD− and Su−.

According to the above-described embodiment, a failure diagnosing circuit for a bridge circuit that drives a motor is formed by connecting a first and a second switching element in series and connecting a third and a fourth switching element in series, connecting one motor input terminal between the first and the second switching elements and connecting the other motor input terminal between the third and the fourth switching elements. Furthermore, a control circuit having three input terminals with a potential at H level or L level as an input is provided, among 8 ways (combinations) of input conditions formed by three of the input terminals, the control circuit outputs a control signal for turning OFF all of the switching elements under a first input condition, outputs a control signal for turning OFF all of the switching elements under a second input condition, outputs a control signal for turning ON only the first switching element under a third input condition, outputs a control signal for turning ON only two of the first and the fourth switching elements under a fourth input condition, outputs a control signal for turning ON only the third switching element under a fifth input condition, outputs a control signal for turning ON only two of the second and the third switching elements under a sixth input condition, outputs a control signal for turning ON only two of the second and the fourth switching elements under a seventh input condition and outputs a control signal for turning ON only either one of the second and the fourth switching elements under an eight input condition, and the failure diagnosing circuit carries out shortcircuit failure diagnosis of the switching elements under the first and the second input conditions end carries out open failure diagnosis of the switching elements under the third, the fifth and the eighth input conditions.

Under the first through the third, the fifth and the eight input conditions, a number of the switching elements in the ON state is one or less among four of the switching elements constituting the bridge circuit. Accordingly, the failure diagnosing circuit can carry out open/shortcircuit failure diagnosis of the respective switching elements without rotating the motor.

By the fourth input condition, only two of the first and the fourth switching elements are turned ON and the motor can be rotated in a right (or left) direction.

By the sixth input condition, only two of the second and the third switching elements are turned ON and the motor can be rotated in left (or right) direction.

By the seventh input condition, the motor can be braked by shortcircuiting the motor input terminals.

Further, according to the above-described embodiment, under the first and the second input conditions, shortcircuit failure diagnosis of the first through the fourth switching elements is respectively carried out based on a number of times of switching from the first input condition to the second input condition.

Four or more of the states are produced based on the number of times of switching and the number of times is made to correspond to the respective switching elements by which shortcircuit failure diagnosis of the first through the fourth switching elements can be carried out individually.

Further, according to the above-described embodiment, among the third, the fifth and the eighth input conditions, under the third input condition, open failure diagnosis of the first switching element is carried out, when the third input condition is switched to the eighth input condition. Under the eighth input condition, the control signal for turning ON only the fourth switching element is outputted from the control circuit, the failure diagnosing circuit carries out open failure diagnosis of the fourth switching element. Under the fifth input condition, open failure diagnosis of the third switching element is carried out, when the fifth input condition is switched to the eighth input condition. Under the eighth input condition, the control signal for turning ON only the second switching element is outputted from the control circuit and the failure diagnosing circuit carries out open failure diagnosis of the second switching element.

When the third or the fifth input condition is switched to the eighth input condition, under the eighth input condition, the control signal for making respectively ON only the fourth or the second switching element is outputted from the control circuit and the failure diagnosing circuit carries out open failure diagnosis of a respective one of the fourth and the second switching elements.

Thereby, four or more states are produced based on the third and the fifth input conditions, switching of input conditions of the third→the eighth and switching of input conditions of the fifth→the eighth and the sates are made to correspond to the respective switching elements by which open failure diagnosis of the first through the fourth switching elements can be carried out individually.

According to the failure diagnosing circuit of the above-described embodiment, open/shortcircuit failure diagnosis of the respective switching elements can be carried out without rotating the motor.

Further, by using two of the input conditions in which all of the switching elements are made OFF, shortcircuit failure diagnosis of the first through the fourth switching elements can be carried out individually.

Further, by using three of the input conditions, open failure diagnosis of the first through the fourth switching elements can be carried out individually.

Further, by using three of the input terminals,, open/shortcircuit failure diagnosis of all of the switching elements of the bridge circuit can be carried out.

Accordingly, in comparison to the case where failure diagnosis is carried out by using four of input terminals in correspondence with a number of switching elements of a bridge circuit, reduction in a number of wirings and reduction in a number of terminals can be achieved and a failure diagnosing circuit can be achieved having a small size and low cost.

Short-circuit failure is first diagnosed and open failure is diagnosed later by which in diagnosing steps, unnecessary conduction of electricity to the motor can be prevented.

Further, as apparent from the above-described explanation, the failure diagnosing circuit according to the above-described embodiment not only can carry out failure diagnosis of the respective switching elements constituting the bridge circuit for driving the motor but also can carry out normal PWM driving and braking of the motor and it is not necessary to separately provide a circuit for normally driving and braking the motor and a circuit for carrying out failure diagnosis.

Explaining in reference to FIG. 2, by switching the third input condition to the fourth input condition, the signal SQ4 is switched from L level to H level by which PWM (pulse width modulation) control of the motor can be carried out in respect of a regular rotational direction of the motor.

In this case, by changing a ratio of L level to H level with respect to the PWM terminal of the control circuit 2, a ratio of L level to H level of the signal SQ4 is changed by which the duty factor of the PWM control of the motor can be changed and the rotational speed of the motor can be adjusted.

Similarly, by switching the fifth input condition to the sixth input condition, the signal SQ2 is switched from L level to H level and the PWM (pulse width modulation) control of the motor can be carried out with respect to a reverse rotational direction of the motor.

In this case, by changing a ratio of L level to H level with respect to the PWM terminal of the control circuit 2, a ratio of L level to H level of the signal SQ2 is changed by which the duty factor of the PWM control of the motor can be changed and the rotational speed of the motor can be adjusted.

Similarly, by switching the eighth input condition to the seventh input condition, the signal SQ2 or the signal SQ4 are switched to L level and H level by which the motor can be braked.

In this case, by changing a ratio of L level to H level with respect to the PWM terminal of the control circuit 2, a ratio of L level to H level of the signal SQ2 or the signal SQ4 is changed and a time period of shortcircuiting both input terminals of the motor is adjusted by which adjustment of the brake in respect of rotation of the motor can be carried out.

By means of the failure diagnosing circuit according to the present invention, either of open failure and shortcircuit failure of the respective switching elements can be diagnosed. Further, in this case, electricity does not need to be conducted to the motor.

Further, shortcircuit failure is first diagnosed and open failure is diagnosed later by which unnecessary conduction of electricity to the motor can be prevented during the diagnosing steps.

The invention being thus described, it will be obvious that the same may be varied in many ways. Such variations are not to be regarded as departure from the spirit and scope of the invention, and all such modifications as would as would be obvious to one skilled in the art are intended to be included within the scope of the following claims.

What is claimed is:

1. A circuit for facilitating failure diagnosis of switching elements constituting a bridge circuit for driving a motor, the bridge circuit being formed by connecting a first and a second switching element in series and connecting a third and a fourth switching element in series, connecting one motor input terminal between the first and the second switching elements and connecting a second motor input terminal between the third and the fourth switching elements, the circuit comprising:

pull up and pull down terminals respectively connected to the input terminals of the motor via resistors;

monitor terminals respectively connected to the input terminals of the motor;

said pull up/down terminals selectively providing two states including a pull up state for providing voltage for facilitating failure diagnosis to the motor input terminals and a pull down state for providing ground potential to the motor input terminals;

means for switching the two states of the pull up/down terminals; and means for opening and closing one of the switching elements at a time;

whereby a change in potential of the monitor terminals in correspondence with each combination of switching the states and opening and closing of the switching elements indicates open and short-circuit failures or lack thereof and thereby facilitates failure diagnosis of the switching elements without energizing the motor.

2. The circuit according to claim 1, said switching means and said means for opening and closing operating according to H and L signal combinations of three control signals.

3. The circuit according to claim 1, further comprising:

means for applying voltage to the first, second, third and fourth switching elements to drive the motor in a forward direction or a reverse direction.

4. The circuit according to claim 1, further comprising:

means for applying voltage to the first, second, third and fourth switching elements to brake the motor.

5. The circuit according to claim 1, further comprising:

means for performing pulse-width modulation control of the motor.

6. A circuit for facilitating failure diagnosis of switching elements constituting a bridge circuit for driving a motor, said bridge circuit being formed by connecting a first and a second switching element in series and connecting a third and a fourth switching element in series, connecting one motor input terminal between the first and the second switching elements and connecting a second motor input terminal between the third and the fourth switching elements, the circuit comprising:

pull up and pull down terminals respectively connected to the input terminals of the motor via resistors;

monitor terminals respectively connected to the input terminals of the motor;

a first switch connected between said pull up terminal and a first voltage source;

a second switch connected between said pull up terminal and ground;

a third switch connected between said pull down terminal and a second voltage source;

a fourth switch connected between said pull down terminal and ground; and a control circuit having first and second input terminals and a pulse width modulation signal input, said control circuit having control outputs connected to said first, second, third and fourth switches and to the first, second, third and fourth switching elements;

said control circuit selectively providing two states including a pull up state for providing voltage for failure diagnosis to the motor input terminals and a pull down state for providing ground potential to the motor input terminals;

said control circuit switching the two states of said pull up/down terminals by opening and closing said first, second, third, and fourth switches;

said control circuit opening and closing one of the switching elements at a time;

wherein a change in potential of the monitor terminals in correspondence with each combination of switching the states and opening and closing of the switching elements indicates open and short-circuit failures in the switching elements or lack thereof and thereby facilitates failure diagnosis of the switching elements without energizing the motor.

7. The circuit according to claim 6, said control circuit switching the two states and opening and closing the switching elements according to H and L signal combinations of three signals received from the first and second input terminals and the pulse width modulation signal input.

8. The circuit according to claim 6, said control circuit controlling the first and fourth switching elements to close and thereby drive the motor in a first direction.

9. The circuit according to claim 6, said control circuit controlling the second and third switching elements to close and thereby drive the motor in a second direction.

10. The circuit according to claim 6, said control circuit short circuiting the motor input terminals to brake the motor.

11. The circuit according to claim 6, wherein said first and second voltage sources are the same voltage source.

12. The circuit according to claim 6, wherein said first and second voltage sources each output 5V.

13. The circuit according to claim 6, wherein the third voltage source outputs 12V.

14. The circuit according to claim 6, wherein the first and third switching elements of the bridge circuit are connected to a third voltage source, and wherein the second and fourth switching elements of the bridge circuit are connected to ground.

15. A method for facilitating failure diagnosis of switching elements constituting a bridge circuit for driving a motor, the bridge circuit being formed by connecting a first and a second switching element in series and connecting a third and a fourth switching element in series, connecting one motor input terminal between the first and the second switching elements and connecting a second motor input terminal between the third and the fourth switching elements, the failure diagnosing circuit comprising the steps of:

connecting pull up and pull down terminals to the input terminals of the motor via resistors;

connecting monitor terminals to the input terminals of the motor;

selectively providing two states including a pull up state for providing voltage for facilitating failure diagnosis to the motor input terminals and a pull down state for providing ground potential to the motor input terminals;

switching the two states of the pull up/down terminals; and opening and closing one of the switching elements at a time;

whereby a change in potential of the monitor terminals in correspondence with each combination of switching the states and opening and closing of the switching elements whereby the potential change indicates open and short-circuit failures or lack thereof and thereby facilitates failure diagnosis of the switching elements without energizing the motor.

16. The method according to claim 15, said switching step and said opening and closing step operating according to H and L signal combinations of three control signals.

17. The method according to claim 15, further comprising the step of:

applying voltage to the first, second, third and fourth switching elements to drive the motor in a forward direction or a reverse direction.

18. The method according to claim 15, further comprising the step of:

means for applying voltage to the first, second, third and fourth switching elements to brake the motor.

19. The method according to claim 15, further comprising the step of:

performing pulse-width modulation control of the motor.

* * * * *